United States Patent
Fujiki

(10) Patent No.: US 7,666,782 B2
(45) Date of Patent: Feb. 23, 2010

(54) WIRE STRUCTURE AND FORMING METHOD OF THE SAME

(75) Inventor: Tsuneo Fujiki, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 169 days.

(21) Appl. No.: 11/418,473

(22) Filed: May 5, 2006

(65) Prior Publication Data

US 2006/0264030 A1    Nov. 23, 2006

(30) Foreign Application Priority Data

May 20, 2005   (JP)   ............................ 2005-148110

(51) Int. Cl.
*H01L 21/4763*   (2006.01)
(52) U.S. Cl. .................. 438/628; 438/620; 438/622; 438/624; 438/627; 438/629; 438/637; 438/639; 257/758; 257/760
(58) Field of Classification Search .............. 438/620, 438/622, 624, 627, 628, 629, 637, 639, FOR. 355, 438/FOR. 395, FOR. 405; 257/758, 760
See application file for complete search history.

(56) References Cited

U.S. PATENT DOCUMENTS

| 6,861,329 | B2 * | 3/2005 | Choi | .......................... | 438/386 |
| 2006/0043420 | A1 * | 3/2006 | Kakoschke et al. | ......... | 257/202 |
| 2006/0183326 | A1 * | 8/2006 | Yoo et al. | ................... | 438/687 |
| 2006/0249850 | A1 * | 11/2006 | Erturk et al. | ................ | 257/775 |

FOREIGN PATENT DOCUMENTS

| JP | 2001-160590 | 6/2001 |
| JP | 2004-153162 | 5/2004 |

OTHER PUBLICATIONS

Luther et al., "Planar Copper-Polyimide Back End of the line, Interconnections For ULSI Devices," VMIC Conference, 1993, Jun. 8-9, pp. 15-21.

* cited by examiner

*Primary Examiner*—N Drew Richards
*Assistant Examiner*—Joannie A Garcia
(74) *Attorney, Agent, or Firm*—Nixon & Vanderhye, P.C.

(57) ABSTRACT

A wire structure, having: a first insulating layer having a lower layer trench formed in an outer surface thereof; a first diffusion preventing film formed on an inner surface of the lower layer trench; a lower layer wire filled in the lower layer trench over the first diffusion preventing film; an interlayer diffusion preventing film formed on the lower layer wire, the interlayer diffusion preventing film made of a high melt point metal or a high melt point metal compound; a second insulating layer formed over the first insulating layer and the interlayer diffusion preventing film, a second insulating layer having a via hole that penetrates through the second insulating layer and the interlayer diffusion preventing film so as to reach the lower layer wire; a conductive second diffusion preventing film formed on an inner surface of the via hall; a conductor filled in the via hole over the second diffusion preventing film, and an adhering film made of the material that forms the interlayer diffusion preventing film, wherein the adhering film is formed so as to extend from an upper surface of the lower layer wire to a side surface of the second insulating layer within the via hall.

18 Claims, 12 Drawing Sheets

WIRE STRUCTURE AND FORMING METHOD OF THE SAME

CROSS-REFERENCE TO RELATED APPLICATION

This application is related to Japanese Patent Application No. 2005-148110 filed on May 20, 2005, whose priority is claimed and the disclosure of which is incorporated by reference in its entirety.

BACKGROUND

1. Technical Field

Example embodiments of the present invention relate to a wire structure and a forming method of the same, and in particular, to a wire structure having a multilayer wire structure which is formed in accordance with a Damascene method using copper, where electromigration resistance and stress migration resistance is increased, as well as a forming method of such a wire structure.

2. Description of the Related Art

Together with the miniaturization of semiconductor devices, wires have also become miniaturized, and as a result, wire resistance and capacitance between wires has increased, and a wire material having a lower resistance has come to be required, in order to increase the speed of the device. Therefore, copper of which the resistance is lower than that of aluminum and which is excellent in electromigration resistance is used as the wire material.

It is difficult to process copper in accordance with a conventional dry etching method, and it is necessary to form wires in accordance with a Damascene method, where a trench for copper wire is formed in advance in an insulating layer, a metal film is formed on the entire surface in such a manner that this trench is filled with the metal film, and the metal film on the insulating layer is removed in accordance with a chemical mechanical polishing method (CMP method) in such a manner that the metal film remains only in the trench. This method is reported in "PLANAR COPPER-POLYIMIDE BACK END THE LINE INTERCONNECTIONS FOR ULSI DEVICES," Proceedings of 10th international VMIC, pp 15-21, 1993, by B. Luther et al. Here, copper is used together with polyimide.

Recently, a dual Damascene method, according to which via holes for connecting the first wire and the second wire and the second trench are simultaneously filled in at the same time, has particularly been used in order to further shorten the process. This method is disclosed in Japanese Unexamined Patent Publication 2001-160590 (conventional art 1) and the like. In the following, a general dual Damascene method is described.

First, as shown in FIG. 10(a), an etching stopping film 801 made of $Si_3N_4$ is formed on a semiconductor substrate 800. A first insulating layer 802 made of a fluorine added silicon oxide film (FSG film) is formed on top of this etching stopping film 801 in accordance with a chemical vapor deposition method (CVD method). A first trench 803 is formed in this first insulating layer 802 in accordance with a photo etching technology. Next, as shown in FIG. 10(b), a first diffusion preventing film 804 made of TaN and a copper seed film are formed on the inner surface of the first trench 803 in accordance with a physical vapor deposition method (sputtering method). After that, a copper film is formed on the first insulating layer 802 so as to fill in the trench 803 in accordance with an electrolytic plating method. The copper film on the first insulating layer 802 is removed in accordance with a CMP method, so that a first wire 805 is formed within the trench 803.

Subsequently, as shown in FIGS. 10(c) and 10(d), an interlayer diffusion preventing film 806 made of $Si_3N_4$ is formed on the gained substrate in accordance with a CVD method, and a second insulating layer 808 made of an FSG film is formed on this interlayer diffusion preventing film 806. Next, as shown in FIGS. 10(e) and 10(f), a resist mask 815 in a predetermined form is formed on the second insulating layer 808, and a via hole 809 is formed in the second insulating layer 808 by means of dry etching so as to reach the interlayer insulating layer 806. After that, the resist mask 815 is removed.

Next, as shown in FIGS. 10(g) and 11(a), a resist mask 817 in a predetermined form having an opening above the via hole 809 is formed on the second insulating layer 808, and a second trench 810 is formed by means of dry etching so as to continue to the via hole 809. After that, the resist mask 817 is removed. Next, as shown in FIG. 11(b), the interlayer diffusion preventing film 806 on the first wire 805 is removed by means of dry etching using the second insulating layer 808 as a mask, so that the first wire 805 is exposed. Furthermore, as shown in FIGS. 11(c) and 11(d), a second diffusion preventing film 812 made of TaN and a copper seed film are formed on the gained substrate in accordance with a sputtering method. A copper film 813 is formed in accordance with an electrolytic plating method so as to have such a film thickness that the via hole and the second trench are completely filled in. The copper film 813 and the second diffusion preventing film 812 on the second insulating film 808 are removed in accordance with a CMP method, and thereby, a conductor and a second wire, which form a dual Damascene wire, are formed within the via hole and the second trench.

In the wire structure that has been formed in accordance with a dual Damascene method according to this conventional art 1, however, the second diffusion preventing film 812, which has been formed on each side walls of the via hole 109 and the second trench 110 (sides of the second insulating film 808) in accordance with a sputtering method, has a deposited film thickness of as small as approximately 3 nm, and discontinuous portions, and thus has a disadvantageous structure in terms of electromigration resistance and stress migration resistance (see FIG. 11(c)). In addition, the copper on the surface of the first wire 805 that has been removed by means of dry etching for the interlayer diffusion preventing film 806, as illustrated in FIG. 11(b) adheres to sides of the second insulating layer 808 in the vicinity of a bottom of the via hole 809. This causes a risk that electromigration may deteriorate.

In recent years, a method for making a thick diffusion preventing film adhere to side walls at the bottom of a via hole (resputtering method) is adopted when a diffusion preventing film is formed after the formation of a via hole and a trench, in order to solve the above described problem with the conventional art 1. This method is disclosed in Japanese Unexamined Patent Publication 2004-153162 (conventional art 2). In the following, the resputtering method is described.

In this conventional art 2, first, as shown in FIGS. 12(a) and 12(b), a via hole 909 and a second trench 910 are formed above the first wire 905 and the first insulating layer 902, in the same manner as in the general dual Damascene method according to the conventional art 1. The interlayer diffusion preventing film 906 made of $Si_3N_4$ on the first wire 905 is dry etched, so that the first wire 905 is exposed.

After that, as shown in FIGS. 12(d) and 12(e), a second diffusion preventing film 912 made of TaN is formed in accordance with a sputtering method. Sputtering etching is carried out on the second diffusion preventing film 912 on the bottom of the via hole 909 by applying an RF bias, and TaN 912a, which is the material that forms the second diffusion preventing film 912 and is removed through etching, is made to adhere to the side walls at the bottom of the via hole 909. Subsequently, as shown in FIG. 12(f), a third diffusion preventing film 913 made of TaN is laminated on the second diffusion preventing film 912, so that the side walls of the via hole 909 and the second trench 910 are coated with a diffusion preventing laminated film having a large film thickness. After that, a copper seed film is formed on the third diffusion preventing film 913 in accordance with a sputtering method. A copper film 914 is formed in accordance with an electrolytic plating method so as to have such a film thickness that the via hole and the second trench are completely filled in. The copper film 914, the third diffusion preventing film 913 and the second diffusion preventing film 912 are removed in accordance with a CMP method, so that a conductor and a second wire which form a dual Damascene wire are formed within the via hole and the second trench.

In accordance with the resputtering method of this conventional art 2, however, as shown in FIG. 12(c), the interlayer diffusion preventing film 906 made of $Si_3N_4$ is dry etched down to the surface of the first wire 905 made of copper, and therefore, copper adheres to the sides of the second insulating layer 905 in the vicinity of the bottom of the via hole 909. As a result of this, there is a possibility that copper may diffuse into the second insulating film 908, and electromigration resistance and stress migration resistance may be deteriorated. Here, in FIG. 12(c), arrows above the first wire 905 indicate a state where copper adheres to the sides of the second insulating layer 908 (regions circled by dotted ovals).

SUMMARY

Example embodiments are provided in view of the above-described problem, and an object thereof is to provide a wire structure having excellent electromigration resistance and stress migration resistance, as well as a method for forming the same.

According to example embodiments, there is provided a wire structure, comprising: a first insulating layer having a lower layer trench formed in an outer surface thereof; a first diffusion preventing film formed on an inner surface of the lower layer trench; a lower layer wire filled in the lower layer trench over the first diffusion preventing film; an interlayer diffusion preventing film formed on the lower layer wire, the interlayer diffusion preventing film made of a high melt point metal or a high melt point metal compound; a second insulating layer formed over the first insulating layer and the interlayer diffusion preventing film, a second insulating layer having a via hole that penetrates through the second insulating layer and the interlayer diffusion preventing film so as to reach the lower layer wire; a conductive second diffusion preventing film formed on an inner surface of the via hole; a conductor filled in the via hole over the second diffusion preventing film, and an adhering film made of the material that forms the interlayer diffusion preventing film, wherein the adhering film is formed so as to extend from an upper surface of the lower layer wire to a side surface of the second insulating layer within the via hole.

Also, according to example embodiments, there is provided a method for forming a wire structure, comprising the steps of: (a) forming a lower layer trench in an outer surface of a first insulating layer; (b) forming a first diffusion preventing film on an inner surface of the lower layer trench and forming a lower layer wire with which the lower layer trench is filled over the first diffusion preventing film; (c) forming an interlayer diffusion preventing film on at least the entirety of the upper surface of the lower layer wire, the interlayer diffusion preventing film made of a high melt point metal or a high melt point metal compound; (d) forming a second insulating layer over the interlayer diffusion preventing film and first insulating layer; (e) etching the second insulating layer to form a via hole which reaches the interlayer diffusion preventing film directly above the lower layer wire; (f) exposing the lower layer wire by etching the interlayer diffusion preventing film within the via hole and forming an adhering film adhere to an area ranging from an upper surface of the lower layer wire to a side surface of the second insulating layer within the via hole, the adhering film made of the material that forms the interlayer diffusion preventing film; and (g) forming a conductive second diffusion preventing film on an inner surface of the via hole and forming a conductor with which the via hole is filled over the second diffusion preventing film.

According to the wire structure and a method for forming the same of example embodiments, an interlayer diffusion preventing film made of a high melt point metal or a high melt point metal compound is formed on top of a lower layer wire, and a via hole and an upper layer trench are formed in a second insulating layer as an upper layer, and after that, the interlayer diffusion preventing film is etched so that the material thereof adheres to the side walls (sides of the second insulating film) at the bottom of the via hole. As a result, even in the case where the lower layer wire (for example, a copper wire) is etched through this etching, the metal material of the lower layer wire does not adhere to the side walls at the bottom of the via hole. That is to say, though in general, the width of via holes is no greater than the width of lower layer wires and the side walls at the bottom of via holes are close to the upper surface of lower layer wires, and therefore, the metal material of lower layer wires easily adheres to second insulating films at the time of etching, an adhering film can prevent the metal material from adhering to the second insulating film without fail according to example embodiments. As a result of this, the metal material of the first wire does not diffuse into the second insulating layer, and thus, the electromigration resistance increases.

Further, a second diffusion preventing film that is formed in post processing is formed on the sides of the second insulating layer with the adhering film as a base so as to have a film thickness of no less than 5 nm, which is thicker than that of the conventional art 1. Therefore, the material (for example, copper) of the conductor that is formed within the via hole can be effectively prevented from diffusing into the second insulating layer, and at the same time, the electromigration resistance increases.

In addition, according to example embodiments, a diffusion preventing film made of a high melt point metal or a high melt point metal compound is formed on the upper surface of the first wire, and therefore, the film stress in the interface between the first wire and the interlayer diffusion preventing film is stable, and as a result, the stress migration resistance increases, and a highly reliable wire structure can be gained.

Here, the above-described effects of example embodiments can be gained in a multilayer wire structure.

DETAILED DESCRIPTION OF THE PREFERRED EXAMPLE EMBODIMENTS

Figure 1A:
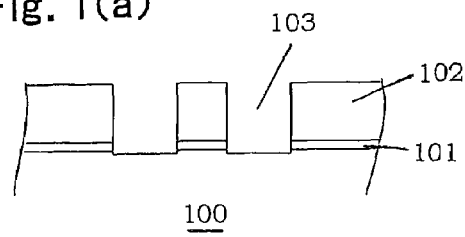
FIGS. 1(a) to 1(h) shows cross sectional diagrams each illustrating a portion of a wire structure during a manufacturing process according to a first example embodiment.

In accordance with example embodiments, a wire structure, comprising: a first insulating layer having a lower layer trench formed in an outer surface thereof; a first diffusion preventing film formed on an inner surface of the lower layer trench; a lower layer wire filled in the lower layer trench over the first diffusion preventing film; an interlayer diffusion preventing film formed on the lower layer wire, the interlayer diffusion preventing film made of a high melt point metal or a high melt point metal compound; a second insulating layer formed over the first insulating layer and the interlayer diffusion preventing film, a second insulating layer having a via hole that penetrates through the second insulating layer and the interlayer diffusion preventing film so as to reach the lower layer wire; a conductive second diffusion preventing film formed on an inner surface of the via hole; a conductor filled in the via hole over the second diffusion preventing film, and an adhering film made of the material that forms the interlayer diffusion preventing film, wherein the adhering film is formed so as to extend from an upper surface of the lower layer wire to a side surface of the second insulating layer within the via hole.

The wire structure of example embodiments may be provided with a substrate, in addition to the above described basic structure. In this case, the first insulating layer may be formed on the substrate directly or with another layer in between, or the first insulating layer may function as the substrate. In addition, in the case where the first insulating layer is formed on the substrate, an etching stopping film may be formed between the substrate and the first insulating layer. As a result of this, even in the case where the lower layer trench is formed by etching the first insulating layer, the progress of etching is blocked before the etching reaches the substrate with the etching stopping film.

In addition, the wire structure of example embodiments may be a two-layer wire structure where the second insulating layer is further provided with an upper layer trench which continues to the via hole and has the second diffusion preventing film on the inner surface, and the upper layer wire, which is connected to the conductor, is formed within the upper layer trench over the second diffusion preventing film. The wire structure of example embodiments may further be a three-or-more layer wire structure where this structure having a conductor and an upper layer wire in the second layer are repeatedly layered in the same manner. In the case where the three-or-more layer wire structure is employed, it is preferable, as in the above described basic structure, that the interlayer diffusion preventing film is formed on, for example, the wire in the second layer, and an adhering film made of the material that forms the interlayer diffusion preventing film is formed on side walls at a bottom of the via hole within the insulating layer, which is the third layer.

In addition, the number of wires within each wire layer is not particularly limited, and may be one or more. In the case where more than one wire is provided within the same wire layer and adjacent wires have different potentials, the interlayer diffusion preventing films on the respective adjacent wires are separated from each other in order to prevent these wires from short-circuiting.

In the following, the respective components of the wire structure of example embodiments are described.

(Substrate)

According to example embodiments, the substrate is not particularly limited, and semiconductor substrates such as silicon and gallium, compound semiconductor substrates, SOI substrates, and insulating substrates (for example, glass substrates and resin substrates) can be cited as examples. In addition, semiconductor elements, such as MOS transistors, memory elements, capacitor elements, and resistor elements may be formed on these substrates.

(First and Second Insulating Layers)

According to example embodiments, as the first and second insulating layers, organic polymer films (for example, SILK, made by Dow Chemical Company), silicon oxide films ($SiO_2$ films), carbon added silicon oxide films (SiOC films), fluorine added silicon oxide films (FSG films) and silicon nitride films ($Si_3N_4$ films) can be cited, and from among these, FSG films are preferable.

The method for forming the first and second insulating layers is not particularly limited, and a chemical vapor deposition method (CVD method) and an application method can be cited as examples.

(Lower Layer Wire, Conductor, Upper Layer Wire and the Like)

According to example embodiments, the wire material for the lower layer wire, the conductor, the upper layer wire and the like is not particularly limited, and aluminum, aluminum alloys, copper, and copper alloys can be cited as examples. Copper and copper alloys having a resistance that is lower than that of aluminum, as well as excellent electromigration resistance, are preferable. As the copper alloys, copper alloys which include one or more types from among tin, zirconium and palladium are preferable.

The method for forming the lower layer wire, the conductor and the upper layer wire is not particularly limited, and a method where a metal seed film is formed in accordance with a physical vapor deposition method (sputtering method) so as to have a film thickness of approximately 100 nm to 150 nm, and after that, the via hole and the trench are completely filled in with a metal film in accordance with an electrolytic plating method, and then, excessive metal film is removed in accordance with a chemical mechanical polishing method (CMP method), etching or the like, and a method where the via hole and the trench are completely filled in with a metal film in accordance with an electrolytic plating method, and excessive metal film is removed in accordance with a CMP method, etching or the like can be cited as examples.

(First and Second Diffusion Preventing Film and Interlayer Diffusion Preventing Film)

According to example embodiments, a material for the first diffusion preventing film may be a material which makes it difficult for metal atoms that form the lower layer wire to diffuse into the first insulating film, and Si3N4, Ta, TaN, W, WSiN, Ti and TiN can be cited as examples. In the case where the lower layer wire is made of copper or a copper alloy, high melt point metals and high melt point metal compounds, such as Ta, TaN, W, WSiN, Ti and TiN are preferable, and Ta and TaN are particularly preferable.

As a material for the interlayer diffusion preventing film, it is preferable to use a material that does not include such as Si3N4 having high specific inductive capacity considering reduction of interlayer capacity, and that makes it difficult for metal atoms that form the lower layer wire and the conductor to diffuse into the first and second insulating films. Examples of such a material include high melt point metals and high melt point metal compounds such as Ta, TaN, W, WSiN, Ti and TiN, and Ta and TaN are particularly preferable.

As for a material for the second diffusion preventing film, the same material as that of the interlayer diffusion preventing film is preferable from the same point of view as with the selection of the material for the interlayer diffusion preventing film.

The first and second diffusion preventing films and the interlayer diffusion preventing film can be formed either as a single layer film (one layer) or as a laminated film where two or more layers are laminated in accordance with a known technology, such as a sputtering method or a CVD method. Further, as for the film thickness, the first diffusion preventing film is approximately 10 nm to 20 nm, preferably, 12 nm to 18 nm, the interlayer diffusion preventing film is approximately 10 nm to 50 nm, preferably 20 nm to 40 nm, and the second diffusion preventing film is no less than 5 nm, preferably, 5 nm to 10 nm on the bottom of the via hole, and no less than 5 nm, preferably 5 nm to 10 nm on the sides of the via hole.

In the following, concrete example embodiments are described in reference to the drawings.

First Example Embodiment

FIGS. 1 and 2 respectively show cross sectional diagrams each illustrating a portion wire structure during the manufacturing process according to a first example embodiment.

The forming method for a wire structure according to this first example embodiment is concretely described in the following. First, an etching stopping film 101 made of Si3N4 is formed on top of a semiconductor substrate 100, and furthermore, a first insulating layer 102 is formed so as to have a film thickness of 200 nm to 400 nm. The first insulating layer 102 is dry etched using a photoresist film (not shown) as a mask so that a plurality of first trenches (lower layer trenches) 103 are formed (see FIG. 1(a)).

Next, a first diffusion preventing film 104 made of TaN is formed so as to cover the surface of the first insulating layer 102 and the inner surface of the respective first trenches 103, and have a film thickness of 10 nm to 20 nm. A copper seed film is formed on the first diffusion preventing film 104 so as to have a film thickness of 100 nm to 150 nm, and a copper film is formed on the surface of the copper seed film by means of electrolytic plating of copper, so as to have such a film thickness as to completely fill in the first trenches 103. Subsequently, the copper film and the first diffusion preventing film 104 on the first insulating layer 102 are removed in accordance with a CMP method, so that a plurality of first wires (lower layer wires) 105 are formed (see FIG. 1(b)). At this time, two-stage polishing can be carried out in accordance with a CMP method.

An example of the two-stage polishing in accordance with a CMP method is described in the following. In a first stage, polishing is carried out using abrasive grains such as silica (silicon oxide), alumina (aluminum oxide) or ceria (cerium oxide), and a polishing agent (slurry) which includes an oxidant, such as a hydrogen peroxide solution. A polishing agent known as a general polishing agent for Cu-CMP and includes aluminum oxide abrasive grains and 2.5 weight % of a hydrogen peroxide solution, for example, is used with a flow rate of 200 ml/min, and the copper is removed at a polishing rate of 600 nm/min under a polishing pressure of 21 kPa, rotating speed of the platen of 90 rpm and rotating speed of the wafer of 85 rpm. At a point in time when the first diffusion preventing film 104 is exposed from regions other than the inside of the first trenches 103 is the finishing point of polishing. In order to gain a higher level of flatness, the polishing rate for removing copper immediately before the first diffusion preventing film 104 is exposed may be adjusted to no higher than 200 nm/min under a polishing pressure of 14 kPa, rotating speed of the platen of 45 rpm and rotating speed of the wafer of 43 rpm.

In the second stage, polishing is carried out using a polishing agent which includes abrasive grains such as silica (silicon oxide), alumina (aluminum oxide) or ceria (cerium oxide). A polishing agent which includes silica abrasive grains, for example, is used with a flow rate of 200 ml/min, and copper is removed at a polishing rate of no higher than 100 nm/min, the first diffusion preventing film 104 is removed at a polishing rate of no higher than 100 nm/min, and the first insulating layer 102 is removed at a polishing rate of no higher than 10 nm/min under a polishing pressure of 21 kPa, rotating speed of the platen of 100 rpm, and rotating speed of the wafer of 93 rpm, so that the first insulating layer 102 is exposed from regions other than the inside of the first trenches 103.

Figure 1E:
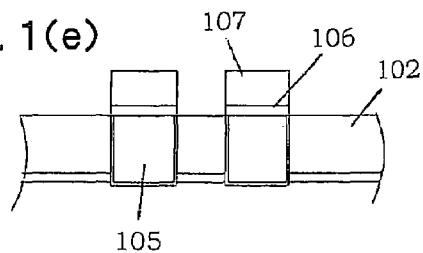
Figure 1B:
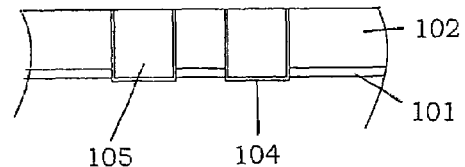
Figure 1F:
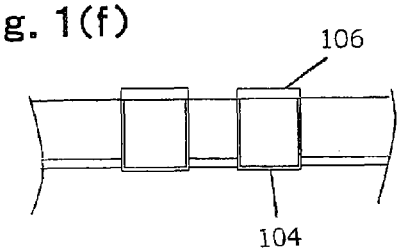
Figure 1C:
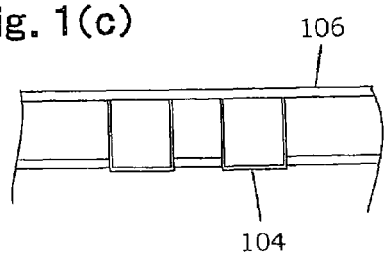

Next, as shown in FIG. 1(c), an interlayer diffusion preventing film 106 made of TaN having a film thickness of 10 nm to 50 nm is formed on top of the first wires 105 and the first insulating layer 102 in accordance with a sputtering method or a CVD method. Here, a high melt point metal film, such as Ta or Ti, a high melt point metal nitride film, such as WN or WSiN, or a laminated film such as TaN/TN, having approximately the same film thickness, may be used instead of TaN.

In the case of a sputtering method (TaN), the process can be carried out under conditions where the DC power is set at, for example, 1000 W. In addition, in the case of a CVD method (TiN), the process can be carried out using, for example, TDMAT (tetradimethylamino titanium) as a material gas and an He gas as a bubbling gas under conditions where the film forming temperature is 300° C. to 400° C., and the pressure is 1 Torr to 10 Torr.

Figure 1G:
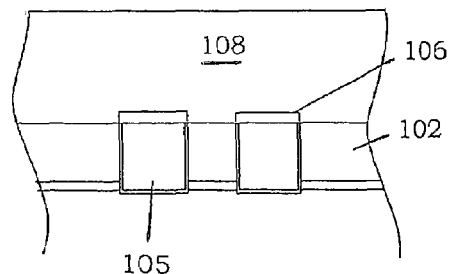
Figure 1D:
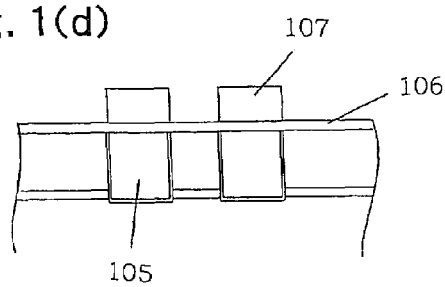

Next, as shown in FIGS. 1(d) to 1(f), the interlayer diffusion preventing film 106 on the first insulating layer 102 is removed through dry etching using a resist mask 107, so that the interlayer diffusion preventing film 106 remains only on the entirety of the upper surface of the first wire 105 and the upper surface of the first diffusion preventing film 104. As for the conditions for dry etching, 10 mT, $Cl_2/BCl_3/CHF_3/Ar$: 60/35/5/40 sccm, the source 800 W/bias 125 W, 15 sec, for example, can be selected.

Figure 1H:
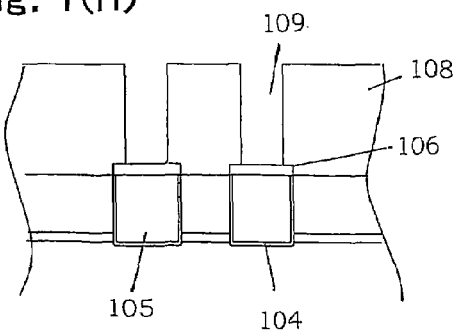
Figure 2A:
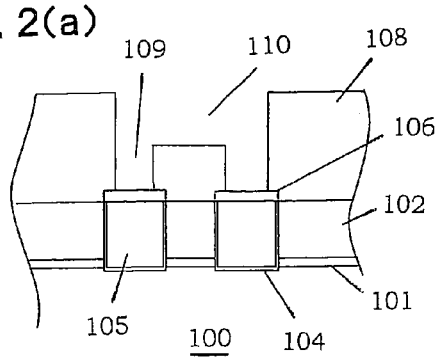
FIGS. 2(a) to 2(e) shows cross sectional diagrams each illustrating the portion of the wire structure during the manufacturing process continued from the process in FIG. 1.

Next, as shown in FIG. 1(g), a second insulating layer 108 made of FSG having a film thickness of 600 nm to 800 nm is formed on the interlayer diffusion preventing film 106 and the first insulating layer 102 in accordance with a CVD method. Subsequently, as shown in FIG. 1(h), via holes 109 of which the width is no greater than the width of the first wires 105 are formed above the respective first wires 105 so as to reach the interlayer diffusion preventing film 106 in accordance with a dry etching technology using a resist mask. Furthermore, as shown in FIG. 2(a), a second trench (upper layer trench) 110 for connecting the upper portions of a pair of the via holes 109 that are adjacent is formed. That is to say, microscopic holes and a wire trench are formed in a dual Damascene method. In this case, the width W1 of the first wires is, for example, set to 140 nm to 200 nm, and the width W2 of the via holes 109 is set to 120 nm to 160 nm. In addition, as the conditions for dry etching, $C_4F_6/O_2/Ar$: 30/30/800 sccm, bias 3000 W, 30 mT, 70 sec, for example, can be selected.

Figure 2D:
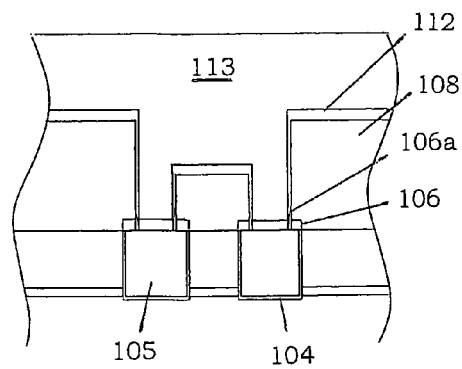
Figure 2B:
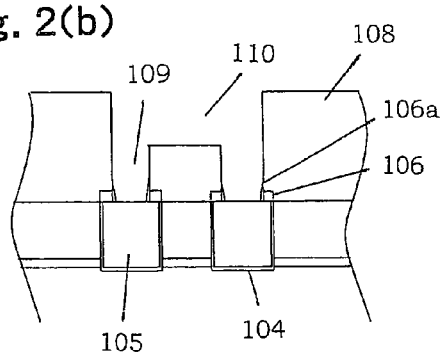

Next, as shown in FIG. 2(b), sputtering etching is carried out on the interlayer diffusion preventing film 106 which are exposed on the bottom of the via holes for 10 seconds to 30 seconds using an inert gas of Ar, Xe, He or the like under power of 100 W to 350 W, so that the first wires 105 are exposed. At this time, the width of the via holes 109 is not larger than the width of the first wires 105, and therefore, TaN, which is the material forming the interlayer diffusion preventing film 106, scatters in all directions during sputtering etching and adheres to the side walls at the bottom of the via holes 109 (the sides of the second insulating layer 108), and adhering films 106a made of TaN are formed in a ring form. At this time, the adhering films 106a are formed, as shown in FIG. 3, in such a manner that the width W of the contact with the first wire 105 is approximately 1 nm to 7 nm (preferably not less than 5 nm) and the height H is approximately 3 nm to 15 nm (preferably not less than 10 nm).

These adhering films 106a are formed so as to extend from the upper surface of the first wires 105 to the sides of the second insulating layer 108 at the via holes, and thereby, copper adheres to the adhering films 106a and does not adhere to the sides of the second insulating film 108, even in the case where etched copper scatters off the surface of the first wires 105 at the time of sputtering etching, and thus, the electromigration resistance can be improved. It is preferable for the film thickness of the interlayer diffusion preventing film 106 to be 10 nm to 50 nm for the formation of the adhering films 106a having the above-described size. Furthermore, as described above, it is preferable for the conditions for sputtering etching of the interlayer diffusion preventing film 106 to be inert gas: Ar, Xe, He or the like, power: 100 W to 350 W, time for etching: 10 sec to 30 sec. Here, in the case where the width W of the adhering films 106a is less than 1 nm and/or the height H is less than 3 nm, reliability (particularly, electromigration resistance) becomes low.

Figure 2C:
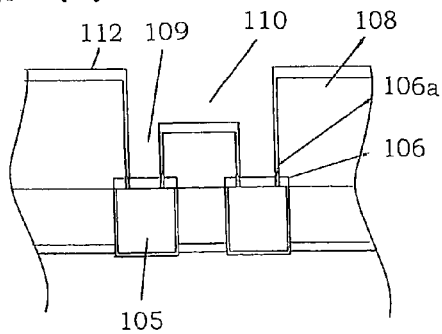
Figure 3:
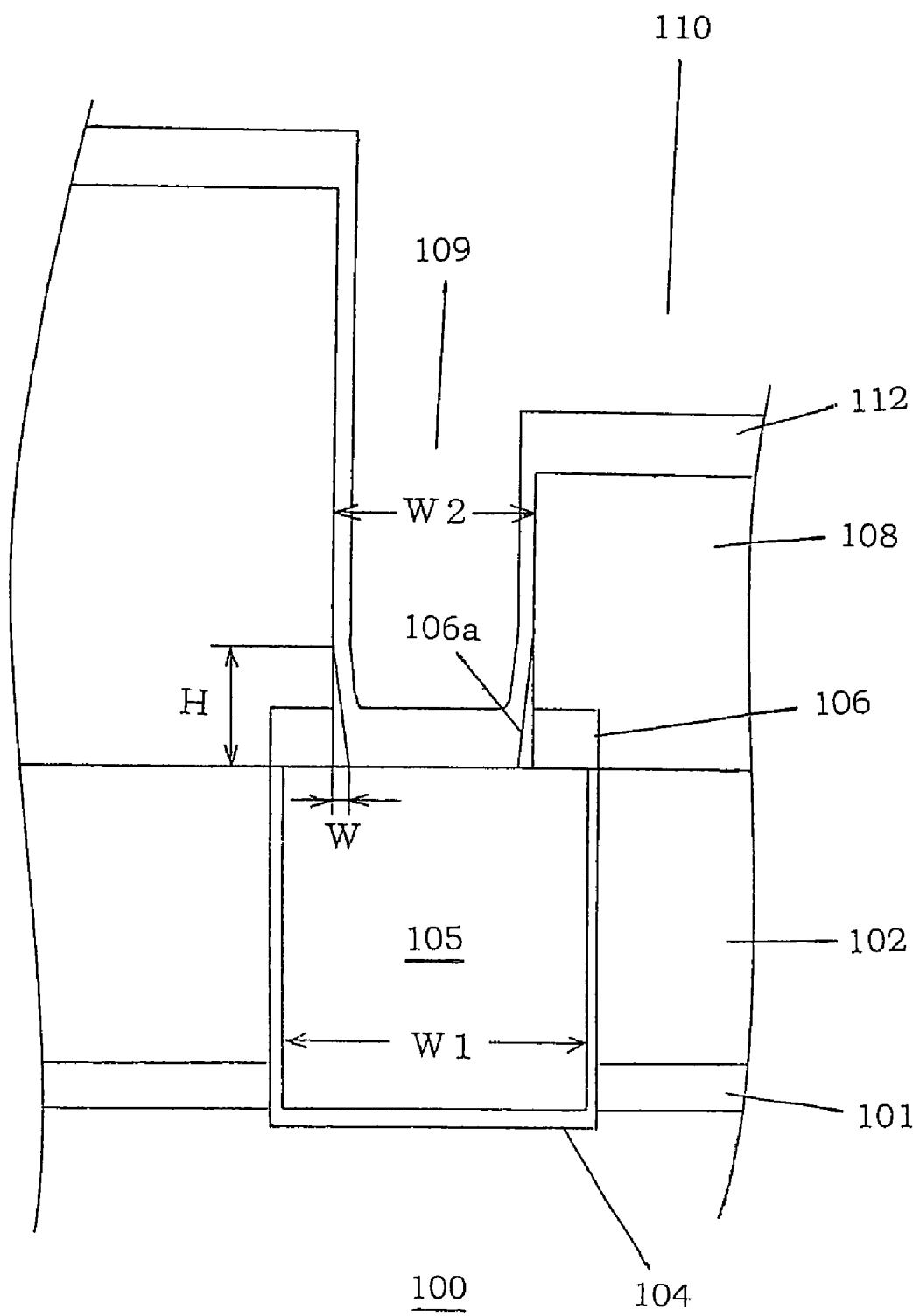
FIG. 3 is an enlarged diagram of the portion of FIG. 2(c)

Next, as shown in FIG. 2(c) and FIG. 3, a second diffusion preventing film 112 made of TaN is formed so as to cover the surface of the second insulating layer 108 and the inner surface of the second trench 110 and the via holes 109. At this time, the second diffusion preventing film 112 is formed so as to cover the upper surface of the first wires 105 and the surface of the adhering films 106a on the bottom of the via holes 109. As a result of this, the sides of the second insulating layer 108 at the bottom of the via holes 109 are coated with a thick laminated film made of the second diffusion preventing film 112 and the adhering film 106a. In addition, the portions of the second diffusion preventing film 112 which are located above the adhering films 106a are formed on the sides of the second insulating layer so as to have a relatively large film thickness of no less than 5 nm with the adhering films 106a as a base. Here, the film thickness of the portions of the second diffusion preventing film which settle on the upper surface of the first wires 105 within the via holes 109 is approximately 5 nm to 10 nm.

As described above, a relatively thick film is formed on the inner surface of the via holes 109 of the second diffusion preventing film 112 and the adhering films 106a, and therefore, copper atoms in copper films with which the via holes are filled in during post-processing can be effectively prevented from diffusing into the second insulating layer 108, and thus, the electromigration resistance can be improved.

Next, as shown in FIG. 2(d), a copper seed film having a film thickness of 30 nm to 150 nm is formed on top of the second diffusion preventing film 112 in accordance with a dual Damascene method, and a copper film 113 is formed on the second insulating layer 108 so as to have such a film thickness as to completely fill in the via holes 109 and the second trench 110 in accordance with an electrolytic plating method. After that, annealing processing is carried out at a temperature of 100° C. to 400° C. for 10 seconds to 60 minutes, in order to stabilize grain growth and the polishing rate of plated copper. After that, the copper film 113 and the second diffusion preventing film 112 on the second insulating layer 108 are removed in accordance with a CMP method, and thereby, conductors 114 are formed within the via holes, and at the same time, a second wire (upper layer wire) 115 is formed within the second trench 110. A two-layer wire structure is formed in the steps leading up to this point.

Figure 2E:
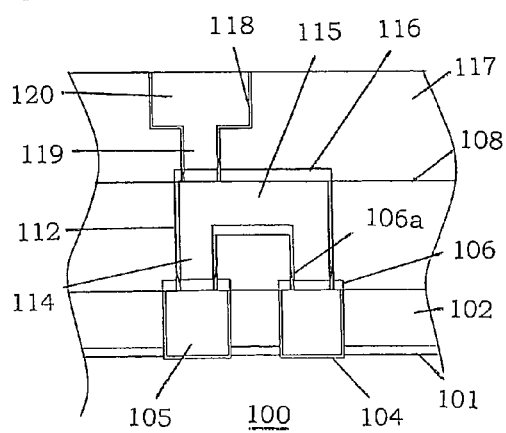

Next, as shown in FIG. 2(e), a dual Damascene wire structure which is the third layer is formed on the second wire 114. In this case, the same materials and method as those for the dual Damascene wire structure which is the second layer having the conductors 114 and the second wire 115 may be used. That is to say, a fourth diffusion preventing film 116 made of a high melt point metal or a high melt point metal compound is formed, such as Ta or TaN, on the second wire 115. On top of this, a third insulating layer 117 is formed, and a via hole and a third trench are formed in the third insulating layer 117. Adhering films are formed on the sides at the bottom of the via hole by carrying out sputtering etching on the fourth diffusion preventing film 116, and a conductor 119 and a third wire 120 are formed inside the via hole and the third trench via a fifth diffusion preventing film 118.

Second Example Embodiment

FIGS. 4 and 5 respectively show cross sectional diagrams each illustrating a portion of the wire structure during the manufacturing process according to a second example embodiment. Here, mainly points of the second example embodiment which are different from the first example embodiment are described in detail.

Figure 4A:
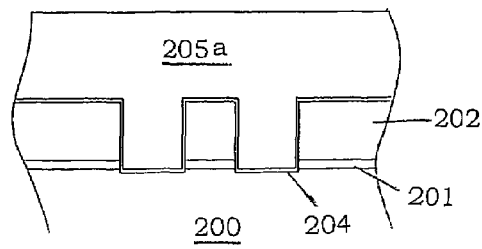
FIGS. 4(a) to 4(f) shows cross sectional diagrams each illustrating a portion of a wire structure during a manufacturing process according to a second example embodiment.
Figure 4B:
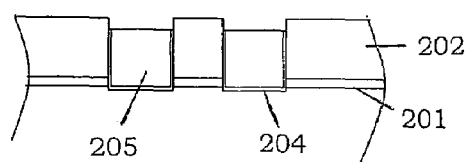

In the second example embodiment, as shown in FIG. 4(a), a copper film 205a having a film thickness of 100 nm to 150 nm is formed on a first insulating layer 202 with a first diffusion preventing film (TaN) 204 having a film thickness of 10 nm to 20 nm in between, in accordance with the same method as that in the first example embodiment, so as to completely fill in the first trenches. Next, as shown in FIG. 4(b), the copper film 205a and the first diffusion preventing film 204 on the first insulating layer 202 are removed in accordance with a CMP method where the polishing rate of the metal film is higher than that of the first insulating layer 202, so that first wires 205 are formed. At this time, the upper surface of the first wires 205 is made lower than the surface of the first insulating layer 202 by approximately 10 nm to 50 nm. Here, in FIG. 4(a), a numeric symbol 200 indicates a semiconductor substrate, and a numeric symbol 201 indicates an etching stopping film.

In the CMP method in this case, the following two-stage polishing can be carried out.

In the first stage, polishing is carried out using abrasive grains such as silica (silicon oxide), alumina (aluminum oxide) or ceria (cerium oxide), and a polishing agent (slurry) which includes an oxidant, such as a hydrogen peroxide solution. A polishing agent known as a general polishing agent for Cu-CMP and includes aluminum oxide abrasive grains and 2.5 weight % of a hydrogen peroxide solution, for example, is used with a flow rate of 200 ml/min, and the copper film 205a is removed at a polishing rate of 600 nm/min under a polishing pressure of 21 kPa, rotating speed of the platen of 90 rpm, and rotating speed of the wafer of 85 rpm. At a point in time when the first diffusion preventing film 204 on the first insulating layer 202 is exposed is the finishing point of polishing. In order to gain a higher level of flatness, the polishing rate for removing the copper film 205a immediately before the first diffusion preventing film 204 is exposed may be adjusted to no higher than 200 nm/min under a polishing pressure of 14 kPa, rotating speed of the platen of 45 rpm, and rotating speed of the wafer of 43 rpm.

In the second stage, polishing is carried out using a polishing agent which includes abrasive grains such as silica, alumina or ceria. A polishing agent which includes silica abrasive grains, for example, is used with a flow rate of 200 ml/min, and the copper film 205a is removed at a polishing rate of no higher than 100 nm/min, the first diffusion preventing film 204 is removed at a polishing rate of no higher than 100 nm/min, and the first insulating layer 202 is removed at a polishing rate of no higher than 10 nm/min under a polishing pressure of 21 kPa, rotating speed of the platen of 100 rpm, and rotating speed of the wafer of 93 rpm, and polishing is continued for 30 seconds or longer after the first insulating layer 202 is exposed, that is, so-called over polishing (excessive polishing) is performed.

Figure 4C:
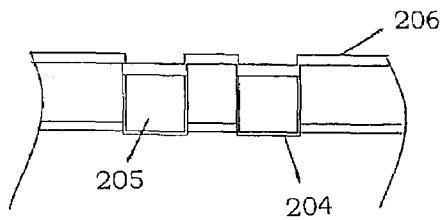
Figure 4D:
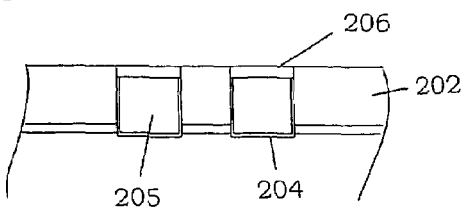
Figure 4E:
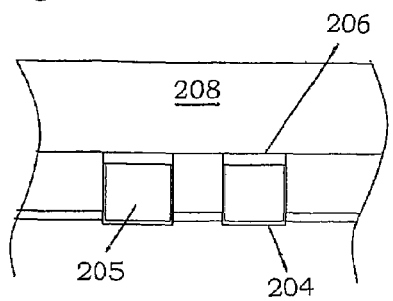
Figure 4F:
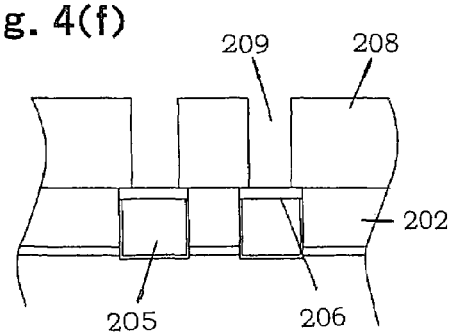

Next, as shown in FIG. 4(c), an interlayer diffusion preventing film 206 made of TaN is formed on the first wires 205 and the first insulating layer 202 in accordance with a sputtering method so as to have a film thickness of approximately 10 nm to 50 nm, which is almost the same as the depth of the upper surface of the first wires 205 from the upper surface of the first insulating layer 202. Next, as shown in FIG. 4(d), dry etching is carried out using a mask which covers the top of the first wires 205, so that the interlayer diffusion preventing film 206 remains only on the first wires 205 and the interlayer diffusion preventing film 206 on the first insulating layer 202 is removed. As a result of this, the upper surface of the interlayer diffusion preventing film 206 becomes of approximately the same height as the surface of the first insulating layer, and thus, a wire structure of which the flatness is superior to that in the first example embodiment can be formed.

In the subsequent process, the same method as in the first example embodiment can be used to form a dual Damascene wire structure. That is to say, as shown in FIG. 4(e) to FIG. 5(a), in accordance with the same method as in the first example embodiment, a second insulating layer 208 is formed on the interlayer diffusion preventing film 206 and the first insulating layer 202, via holes 209, of which the width is no greater than the width of the first wires 205, are formed in the second insulating layer 208, and a second trench 210 for continuing the upper portions of adjacent via holes 209 is formed.

Figure 5A:
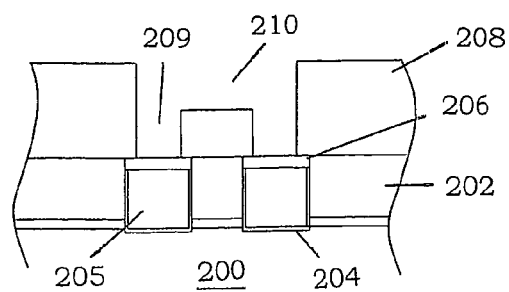
FIGS. 5(a) to 5(d) shows cross sectional diagrams each illustrating the portion of the wire structure during the manufacturing process continued from the process in FIG. 4.
Figure 5B:
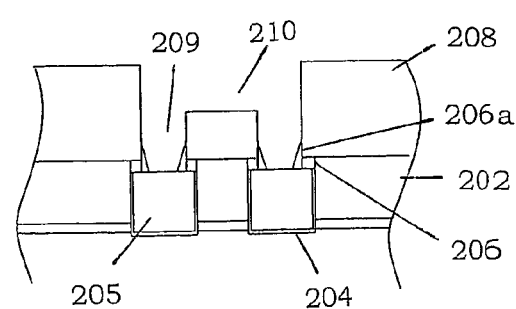
Figure 5C:
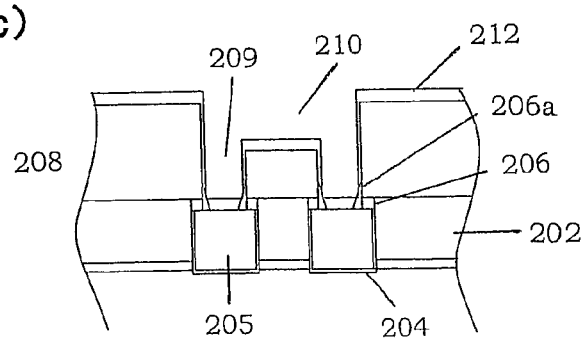
Figure 5D:
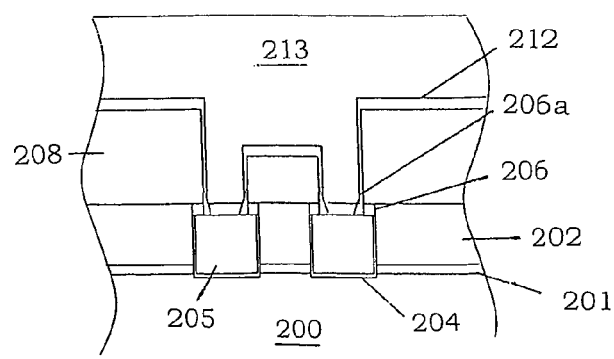

Next, as shown in FIG. 5(b), sputtering etching is carried out on the interlayer diffusion preventing film 206 on the first wires 205, so that adhering films 206a are formed on the sides at the bottom of the via holes 209 and the first wires 205 are exposed. These adhering films 206a are formed so as to have a width of contact with a first wire 205 of approximately 1 nm to 7 nm and a height of approximately 3 nm to 15 nm. Next, as shown in FIGS. 5(c) and 5(d), a second diffusion preventing film 212 made of TaN is formed so as to cover the surface of the second insulating layer 208 and the inner surface of the second trench 210 and the via holes 209. The via holes 209 and the second trench 210 are filled in with a copper film 213, and annealing processing is carried out. The copper film 213 and the second diffusion preventing film 212 on the second insulating layer 208 are removed in accordance with a CMP method.

Third Example Embodiment

FIGS. 6 and 7 respectively show cross sectional diagrams each illustrating a portion of the wire structure during the manufacturing process according to a third example embodiment.

Figure 6A:
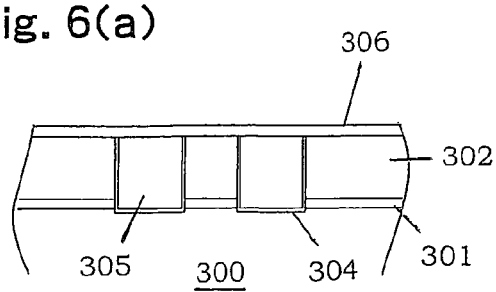
FIGS. 6(a) to 6(f) shows cross sectional diagrams each illustrating a portion of a wire structure during a manufacturing process according to a third example embodiment.

In this third example embodiment, the second and third layers, which are insulating layers, are formed so as to have a single Damascene wire structure. First, as shown in FIGS. 6(a) to 6(c), a first interlayer diffusion preventing film 306 made of TaN having a film thickness of approximately 10 nm to 50 nm is formed on a first wires 305 and a first insulating layer 302 in accordance with a sputtering method, which is the same method as in the first example embodiment. The first interlayer diffusion preventing film 306 on the first insulating layer 302 is removed through etching using a resist mask 307 while leaving the first interlayer diffusion preventing film 306 on the first wires 305, and after that, the resist mask 307 is removed. Here, in FIG. 6(a), a numeric symbol 300 indicates a semiconductor substrate, a numeric symbol 301 indicates an etching stopping film, and a numeric symbol 304 indicates a first diffusion preventing film.

Figure 6D:
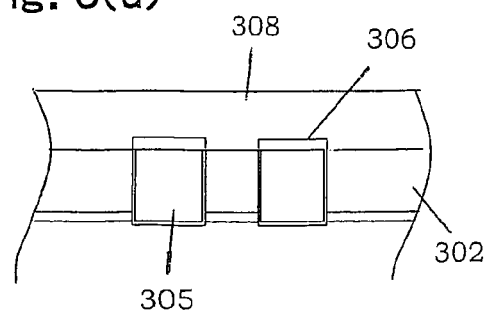
Figure 6B:
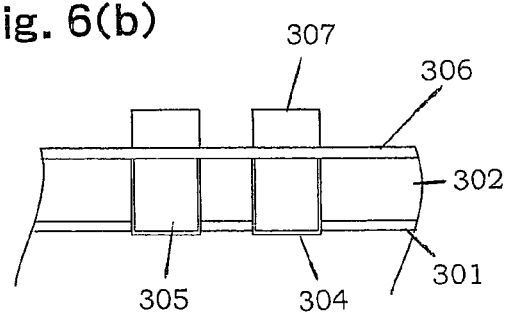

Next, as shown in FIG. 6(d), a second insulating layer 308 made of FSG having a film thickness of approximately 200 nm to 400 nm is formed on the first interlayer diffusion preventing film 306 and the first insulating layer 302 in accordance with a CVD method. The film thickness of this second insulating layer 308 corresponds to the depth of the via holes which are formed in the following process.

Figure 6E:
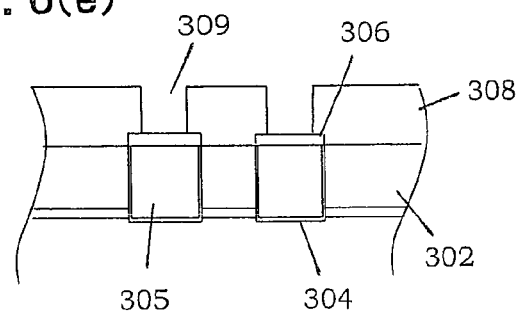
Figure 6C:
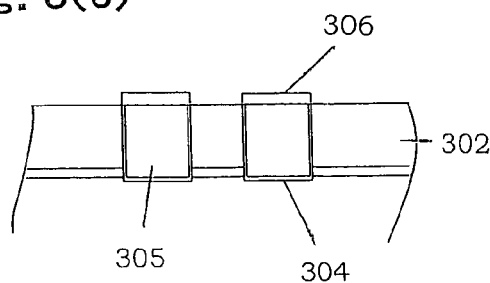
Figure 6F:
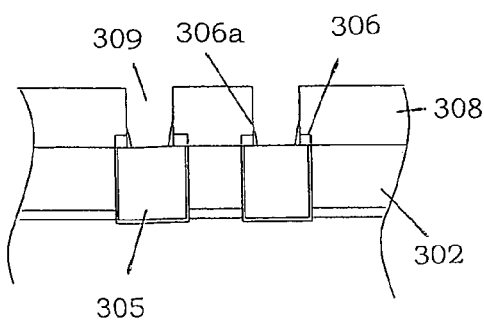

Next, as shown in FIG. 6(e), via holes 309 of which the width is smaller than the width of the first wires 305 are formed in the second insulating layer 308 in accordance with an etching technology using a resist mask. In this process, the first interlayer diffusion preventing film 306 is exposed. Subsequently, as shown in FIG. 6(f), sputtering etching is carried out on the first interlayer diffusion preventing film 306 that is exposed on the bottom of the via holes 309, in the same manner as in the first example embodiment, so that adhering films 306a are formed on the side walls at the bottom of the via holes 309. These adhering films 306a have a width of contact with a first wire 305 of approximately 1 nm to 7 nm and a height of approximately 3 nm to 15 nm.

Figure 7A:
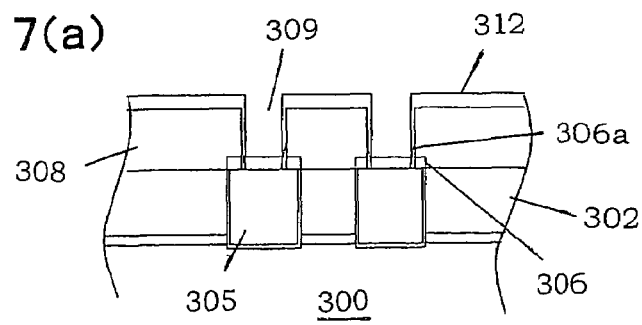
FIGS. 7(a) to 7(d) shows cross sectional diagrams each illustrating the portion of the wire structure during the manufacturing process continued from the process in FIG. 6.
Figure 7B:
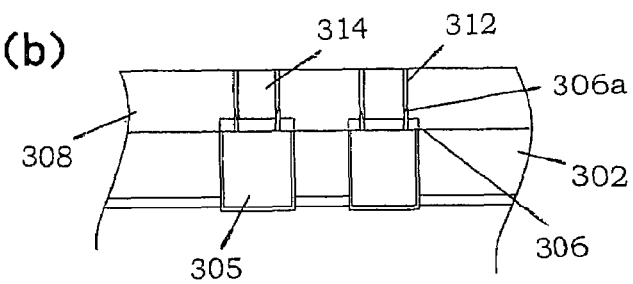

Next, as shown in FIGS. 7(a) and 7(b), a second diffusion preventing film 312 made of TaN is formed so as to cover the surface of the second insulating layer 308 and the inner surface of the via holes 309, and a copper seed film having a film thickness of 30 nm to 150 nm is formed on the second diffusion preventing film 312. A copper film is formed on the second insulating layer 308 in accordance with an electrolytic plating method so as to have such a film thickness as to completely fill in the via holes, and annealing processing is carried out at a temperature from 100° C. to 400° C. for 10 seconds to 60 minutes. After that, the copper film on the second insulating layer 308 is removed in accordance with a CMP method, and conductors 314 are formed within the via holes.

Figure 7C:
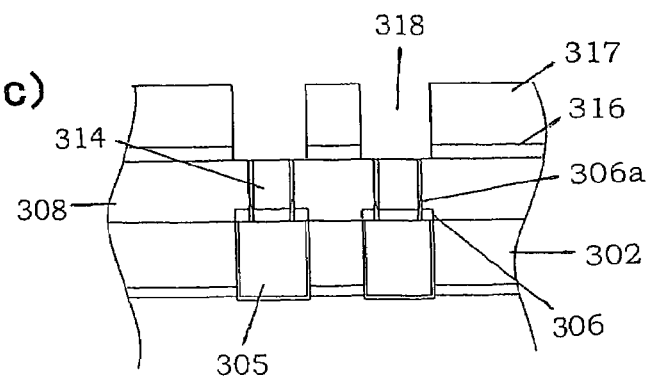

Next, as shown in FIG. 7(c), a second interlayer diffusion preventing film 316 made of $Si_3N_4$, SiC or the like having a film thickness of 30 nm to 50 nm (preferably approximately 40 nm) is formed on the conductors 314 and the second insulating layer 308 in accordance with a CVD method. Furthermore, a third insulating layer 317 made of FSG having a film thickness of approximately 200 nm to 400 nm is formed on the second interlayer diffusion preventing film 316 in accordance with a CVD method. After that, a resist mask is formed on the third insulating layer 317, and the third insulating layer 317 and the second interlayer diffusion preventing film 316 are dry etched, so that second trenches 318 of which the width is greater than the width of the conductors 314 are formed above the respective conductors 314. At the time of this dry etching, the material of the second interlayer diffusion preventing film 316 is a material such as $Si_3N_4$ or SiC that does not include a high melt point metal, and the etching is not sputtering etching, and therefore, no adhering film is formed of the material of the second interlayer diffusion preventing film 316 on the sides of the third insulating layer 317 which are at the bottom of the second trenches 318. However, the electromigration resistance and the stress migration resistance are greatly affected by the diffusion of copper from the side walls at the bottom of the via holes to the insulating films, and therefore, even in the case where no adhering films are formed of the material of the second interlayer diffusion preventing film 316 on the side walls of the second trenches 318, the electromigration resistance and the stress migration resistance are maintained.

Figure 7D:
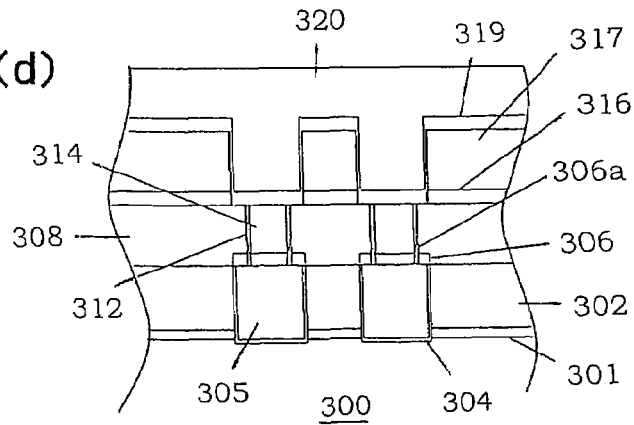

Next, as shown in FIG. 7(d), a third diffusion preventing film 319 made of TaN is formed on the inner surface of the second trenches 318 and on the surface of the third insulating layer 317. It is preferable for this third diffusion preventing film 319 to have a film thickness of no less than 5 nm on the sides of the second trenches 318. After that, a copper film 320 is formed so as to have such a film thickness as to completely fill in the second trenches 318, and the copper film 320 and the third diffusion preventing film 319 are removed in accordance with a CMP method until the third insulating layer 317 is exposed, so that second wires which make contact with the conductors 314 are formed.

Fourth Example Embodiment

FIG. 8 shows cross sectional diagrams each illustrating a portion of the wire structure during the manufacturing process according to a fourth example embodiment.

In this fourth example embodiment, the second layer is formed so as to have a dual Damascene wire structure, in the same manner as in the first example embodiment, and the interlayer diffusion preventing film on the first wires are formed so as to have a width that is greater than the width of the first wires. In the following, mainly points of the fourth example embodiment that are different from the first example embodiment are described.

Figure 8A:
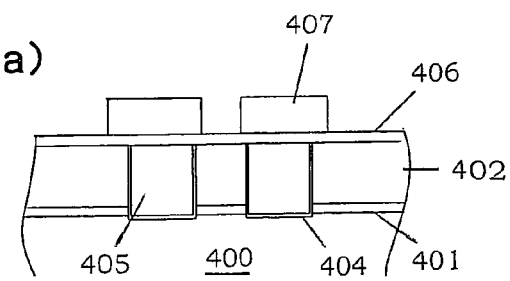
FIGS. 8(a) to 8(d) shows cross sectional diagrams each illustrating a portion of a wire structure during a manufacturing process according to a fourth example embodiment.

FIG. 8(a) shows a state where a resist mask 407 is formed on an interlayer diffusion preventing film 406. This resist mask 407 is formed so as to have a width which is greater than the width of a first wires 405 on top of each first wire 405. The steps up to this point can be carried out in accordance with the same method as in the first example embodiment, except that the size of this resist mask 407 is different from that in the first example embodiment. Here, in FIG. 8(a), a numeric symbol 400 indicates a substrate, a numeric symbol 401 indicates an etching stopping film, a numeric symbol 402 indicates a first insulating film, and a numeric symbol 404 indicates a first diffusion preventing film.

Figure 8B:
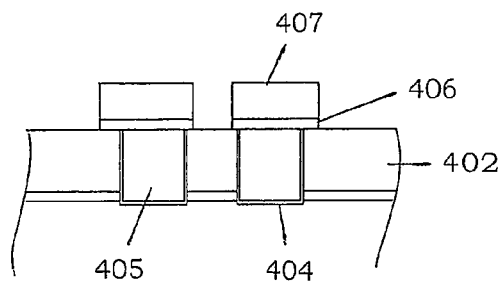
Figure 8C:
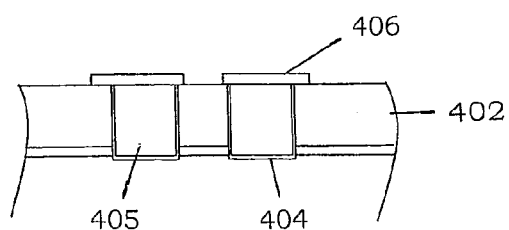

Next, as shown in FIGS. 8(b) and 8(c), the interlayer diffusion preventing film 406 is dry etched using the resist mask 407 under the same conditions as those in the first example embodiment, and then, the resist mask 407 is removed. As a result of this, interlayer diffusion preventing films 406, of which the width is greater than the width of the first wires 405, are formed on top of respective adjacent first wires 405. As described above, the interlayer diffusion preventing films 406 may be formed so as to have a width that is greater than the width of the first wires 405. In the case where the potential of the adjacent first wires 405 is different, however, it is necessary to completely separate and electrically insulate the interlayer diffusion preventing films 406 on top of the first wires 405 from each other, as shown in FIG. 8(c), in order to prevent the first wires 405 from short circuiting. Here, in the case where the potential of the adjacent first wires 405 is the same, no problem arises, even when the interlayer diffusion preventing films 406 on top of the respective first wires 405 are connected.

Figure 8D:
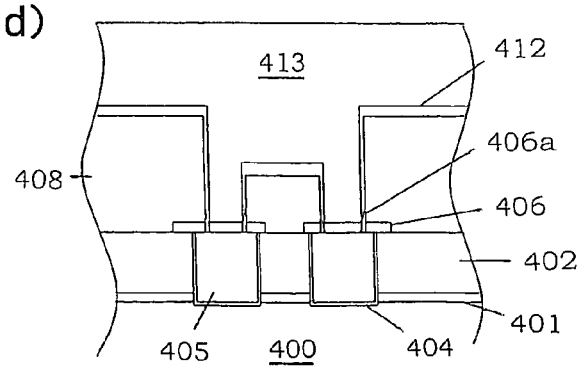

The process after this is carried out in the same manner as described in the first example embodiment in reference FIGS. 1(g) to 2(d), and as shown in FIG. 8(d), conductors and a second wire may be formed by filling the via holes and the second trench in the second insulating layer 408 with a copper film 413, and thus, a dual damascene wire structure is formed. In FIG. 8(d), a numeric symbol 406a indicates adhering films made of the material of the interlayer diffusion preventing film 406, and a numeric symbol 412 indicates a second diffusion preventing film. Furthermore, a dual Damascene wire structure may be formed as the third layer, as described in the first example embodiment in reference to FIG. 1(e).

Fifth Example Embodiment

FIG. 9 shows cross sectional diagrams each illustrating a portion of the wire structure during the manufacturing process according to a fifth example embodiment.

In this fifth example embodiment, the second and third layers, which are made of insulating layers, are formed so as to have a single Damascene wire structure, in the same manner as in the third example embodiment, and the interlayer diffusion preventing films on the first wires are formed so as to have a width that is greater than the width of the first wires. In the following, mainly points of the fifth example embodiment which are different from the third example embodiment are described.

Figure 9A:
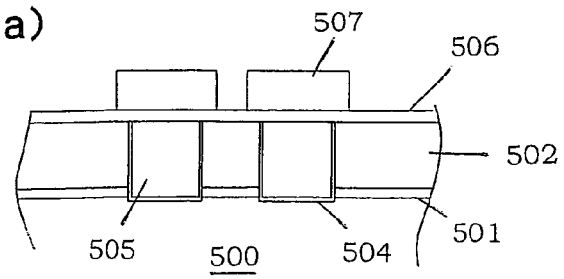
FIGS. 9(a) to 9(d) shows cross sectional diagrams each illustrating a portion of a wire structure during a manufacturing process according to a fifth example embodiment.

FIG. 9(a) shows a state where a resist mask 507 is formed on the first interlayer diffusion preventing film 506. This resist mask 507 is formed so as to have a width which is greater than the width of the first wires 505 on top of each first wire 505. The steps up to this point can be carried out in accordance with the same method as in the third example embodiment, except that the size of this resist mask 507 is different from that in the third example embodiment. Here, in FIG. 9(a), a numeric symbol 500 indicates a substrate, a numeric symbol 501 indicates an etching stopping film, a numeric symbol 502 indicates a first insulating layer, and a numeric symbol 504 indicates a first diffusion preventing film.

Figure 9B:
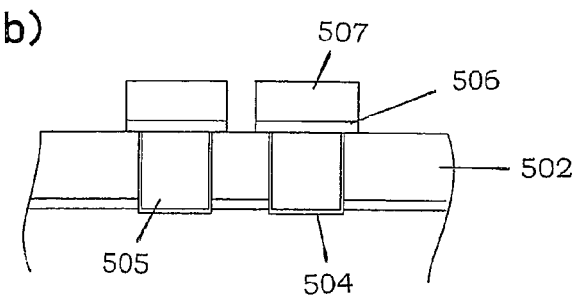
Figure 9C:
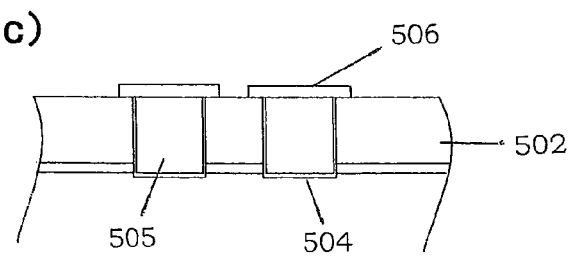

Next, as shown in FIGS. 9(b) and 9(c), the first interlayer diffusion preventing film 506 is dry etched using the resist mask 507 under the same conditions as those in the third example embodiment, and then, the resist mask 507 is removed. As a result of this, first interlayer diffusion preventing films 506 are formed so as to have a width which is greater than the width of the first wires 505 on top of respective adjacent first wires 505. As described above, the first interlayer diffusion preventing films 506 may be formed so as to have a width which is greater than the width of the first wires 505 and completely cover the upper surface of the first wires 505. In the case where the potential of the adjacent first wires 505 is different, however, it is necessary to completely separate and electrically insulate the first interlayer diffusion preventing films 506 on top of the respective first wires 505 from each other, as shown in FIG. 9(c), in order to prevent the first wires 505 from short circuiting. Here, in the case where the potential of the adjacent first wires 505 is the same, no problem arises when the first interlayer diffusion preventing films 506 on top of the respective first wires 505 are connected.

Figure 9D:
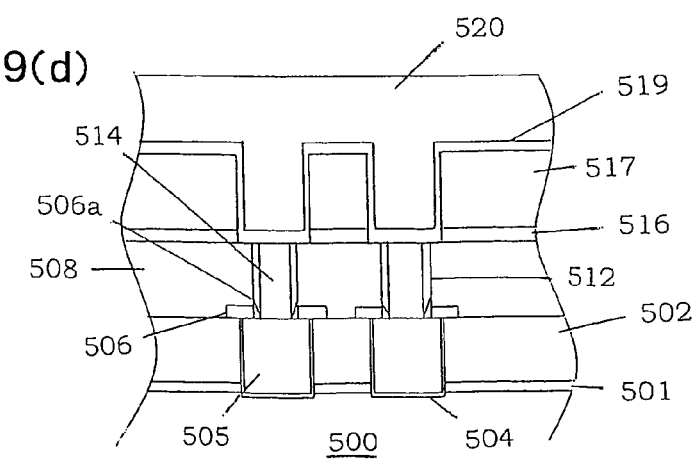
Figure 10A:
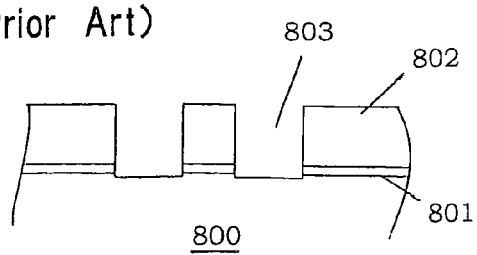
FIGS. 10(a) to 10(g) shows cross sectional diagrams each illustrating a portion of a wire structure during a manufacturing process according to a conventional art 1.
Figure 10B:
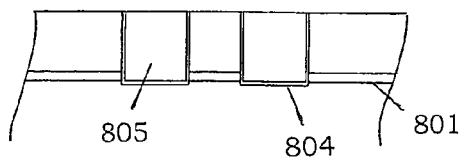
Figure 10C:
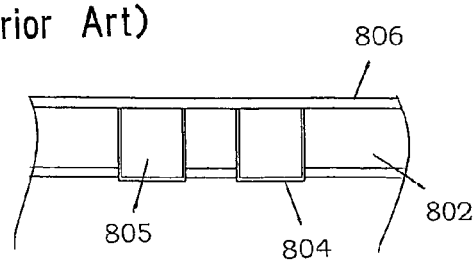
Figure 10D:
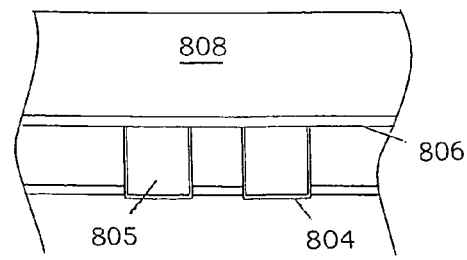
Figure 10E:
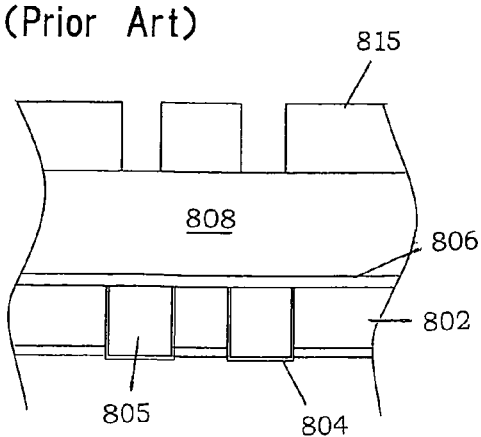
Figure 10F:
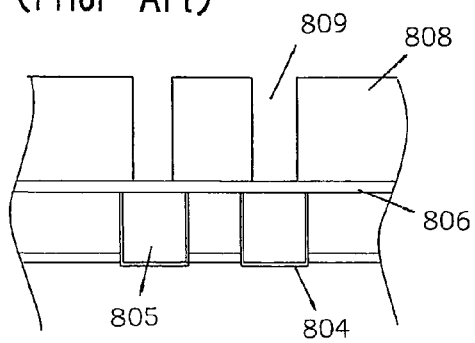
Figure 10G:
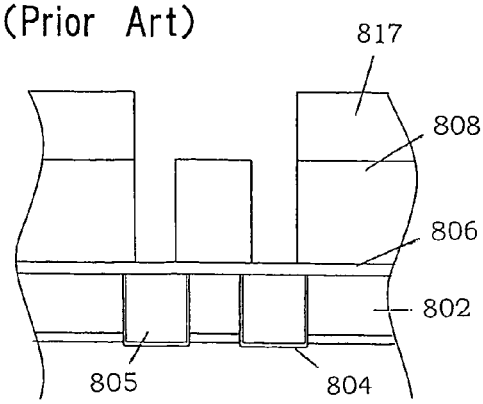
Figure 11A:
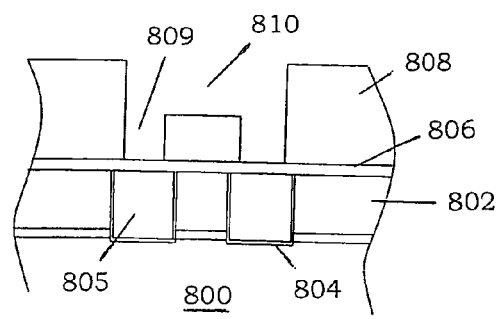
FIGS. 11(a) to 11(d) shows cross sectional diagrams each illustrating the portion of the wire structure during the manufacturing process continued from the process in FIG. 10.
Figure 11B:
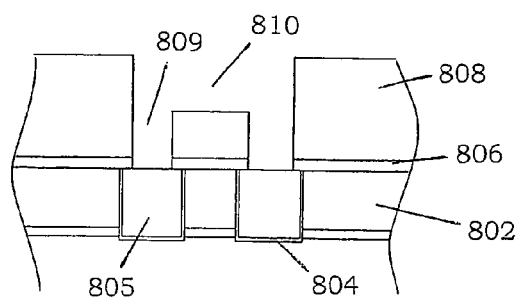
Figure 11C:
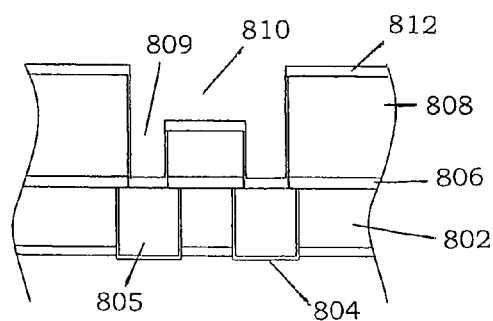
Figure 11D:
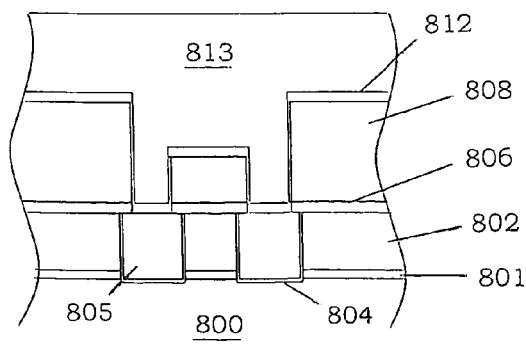
Figure 12A:
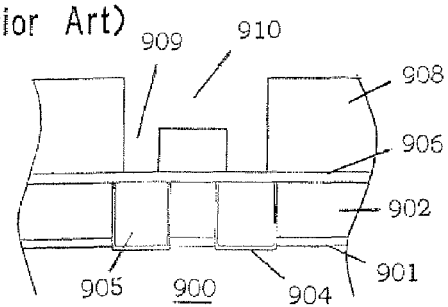
FIGS. 12(a) to 12(g) shows cross sectional diagrams each illustrating a portion of a wire structure during a manufacturing process according to a conventional art 2.
Figure 12E:
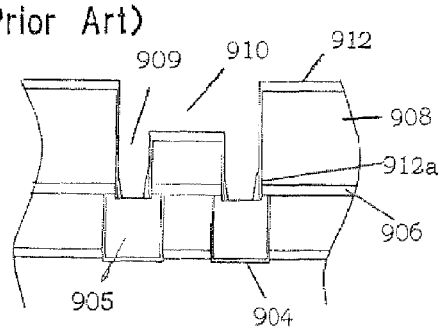
Figure 12B:
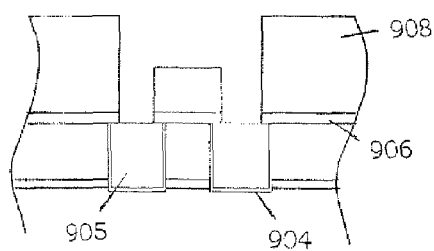
Figure 12F:
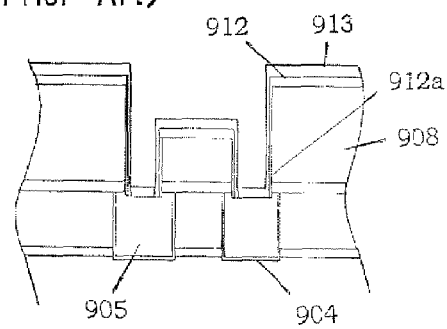
Figure 12C:
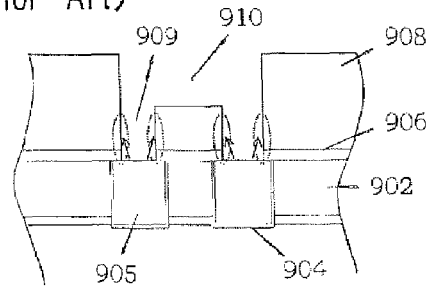
Figure 12D:
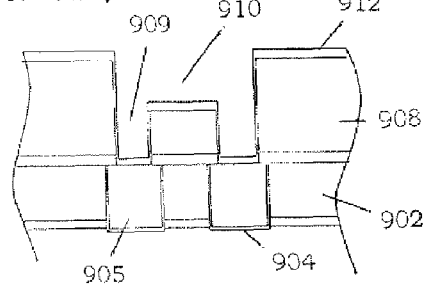
Figure 12G:
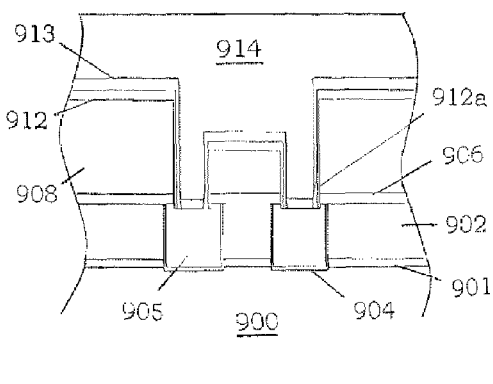

The process after this is carried out in the same manner as described in the third example embodiment in reference FIGS. 6(d) to 7(d), and as shown in FIG. 9(d), conductors 514 may be formed in the second insulating layer 508, and second wires may be formed by filling only the second trenches in the third insulating layer 517 with a copper film 520, and thus, a single Damascene wire structure is formed. Here, in FIG. 9(d), a numeric symbol 506a indicates adhering films made of the material of the first interlayer diffusion preventing film 506, a numeric symbol 512 indicates a second diffusion preventing film, a numeric symbol 516 indicates a second interlayer diffusion preventing film, a numeric symbol 517 indicates a third insulating layer, and a numeric symbol 519 indicates a third diffusion preventing film.

Other Example Embodiments

1. Although cases where a dual Damascene wire structure is manufactured are illustrated in the above-described first, second, and fourth example embodiments, and cases where a single Damascene wire structure is manufactured are illustrated in the third and fifth example embodiments, a dual Damascene wire and a single Damascene wire may be formed in the same insulating layer. In addition, a single Damascene wire layer may be formed on top of a dual Damascene wire layer, or a dual Damascene wire layer may be formed on top of a single Damascene wire layer.

2. The second insulating layer is not limited to a single layer film made of FSG, and may be a laminated film where an etching stopping film made of $Si_3N_4$ or the like having a thickness of approximately 50 nm is formed on an FSG film having a thickness of approximately 400 nm, and an FSG film having a thickness of approximately 400 nm is formed on top of this etching stopping film, and a dual Damascene wire and/or a single Damascene wire may be formed in this laminated film.

The wire structure of the example embodiments can be applied to IC's, LSI's, ULSI's and the like which are provided with MOS transistors, memory elements, capacitor elements, resistor elements or the like on a substrate or in an insulating layer.

What is claimed is:

1. A wire structure, comprising:
   a first insulating layer comprising a lower layer trench formed in an outer surface thereof;
   a first diffusion preventing film formed on an inner surface of the lower layer trench;
   a lower layer wire filled in the lower layer trench over the first diffusion preventing film, wherein said lower layer wire comprises metal;
   an interlayer diffusion preventing film formed on the lower layer wire, the interlayer diffusion preventing film comprising a high melt point metal or a high melt point metal compound;
   a second insulating layer formed over the first insulating layer and the interlayer diffusion preventing film, the second insulating layer comprising a via hole that penetrates through the second insulating layer and the interlayer diffusion preventing film so as to reach the lower layer wire;
   a conductive second diffusion preventing film formed on an inner surface of the via hole;
   a conductor filled in the via hole over the second diffusion preventing film, and
   an adhering film, wherein the adhering film comprises material removed from the interlayer diffusion preventing film as a result of etching the interlayer diffusion preventing film to expose the lower layer wire, wherein the adhering film extends from an upper surface of the lower layer wire to a side surface of the second insulating layer within the via hole to an extent such that, in the event metal is removed from said lower layer wire as a result of said etching, said metal adheres to said adhering film and is inhibited from adhering to said second insulating layer.

2. The wire structure according to claim 1, wherein the adhering film has a width of contact with the lower layer wire of 1 nm to 7 nm and a height of 3 nm to 15 nm.

3. The wire structure according to claim 1,
   wherein the interlayer diffusion preventing film and the second diffusion preventing film comprise a single layer film comprising material selected from Ta, Ti, W, and compounds thereof or a laminated film of two or more layers comprising material selected from Ta, Ti, W, and compounds thereof.

4. The wire structure according to claim 1, wherein the lower layer wire comprises either copper or a copper alloy that includes one or more types from among tin, zirconium and palladium.

5. The wire structure according to claim 1, wherein the first insulating layer comprises a plurality of lower layer trenches, the first diffusion preventing film and lower layer wire being formed within each of the lower layer trenches, the interlayer diffusion preventing film being formed on top of each of the lower layer wires, and the interlayer diffusion preventing films being separated from each other so that lower layer wires having different potentials are not short circuited.

6. The wire structure of claim 1, wherein said material removed from the interlayer diffusion preventing film does not comprise $Si_3N_4$.

7. The method of claim 1, wherein said material removed from the interlayer diffusion preventing film does not comprise $Si_3N_4$.

8. A wire structure, comprising:
   a first insulating layer comprising a lower layer trench formed in an outer surface thereof;
   a first diffusion preventing film formed on an inner surface of the lower layer trench;

a lower layer wire filled in the lower layer trench over the first diffusion preventing film;

an interlayer diffusion preventing film formed on the lower layer wire, the interlayer diffusion preventing film comprising a high melt point metal or a high melt point metal compound;

a second insulating layer formed over the first insulating layer and the interlayer diffusion preventing film, the second insulating layer comprising a via hole that penetrates through the second insulating layer and the interlayer diffusion preventing film so as to reach the lower layer wire;

a conductive second diffusion preventing film formed on an inner surface of the via hole;

a conductor filled in the via hole over the second diffusion preventing film, and an adhering film, wherein the adhering film and the interlayer diffusion preventing film comprise a same material, wherein the adhering film is formed so as to extend from an upper surface of the lower layer wire to a side surface of the second insulating layer within the via hole;

wherein the second insulating layer further comprises an upper layer trench which continues to the via hole and has the second diffusion preventing film on an inner surface thereof; and wherein an upper layer wire which is connected to the conductor is formed within the upper layer trench over the second diffusion preventing film.

9. A wire structure, comprising:

a first insulating layer comprising a lower layer trench formed in an outer surface thereof;

a first diffusion preventing film formed on an inner surface of the lower layer trench;

a lower layer wire filled in the lower layer trench over the first diffusion preventing film;

an interlayer diffusion preventing film formed on the lower layer wire, the interlayer diffusion preventing film comprising a high melt point metal or a high melt point metal compound;

a second insulating layer formed over the first insulating layer and the interlayer diffusion preventing film, the second insulating layer comprising a via hole that penetrates through the second insulating layer and the interlayer diffusion preventing film so as to reach the lower layer wire;

a conductive second diffusion preventing film formed on an inner surface of the via hole;

a conductor filled in the via hole over the second diffusion preventing film, and an adhering film, wherein the adhering film and the interlayer diffusion preventing film comprise a same material, wherein the adhering film is formed so as to extend from an upper surface of the lower layer wire to a side surface of the second insulating layer within the via hole; and wherein the upper surface of the interlayer diffusion preventing film and the upper surface of the first insulating layer have the same height.

10. A method for forming a wire structure, comprising:

(a) forming a lower layer trench in an outer surface of a first insulating layer;

(b) forming a first diffusion preventing film on an inner surface of the lower layer trench and forming a lower layer wire with which the lower layer trench is filled over the first diffusion preventing film, wherein said lower layer wire comprises an upper surface;

wherein said lower layer wire comprises metal;

(c) forming an interlayer diffusion preventing film on the upper surface of the lower layer wire, wherein the interlayer diffusion preventing film comprises a high melt point metal or a high melt point metal compound and entirely covers the upper surface of the lower layer wire;

(d) forming a second insulating layer over the interlayer diffusion preventing film and first insulating layer;

(e) etching the second insulating layer to form a via hole which reaches the interlayer diffusion preventing film directly above the lower layer wire;

(f) exposing the lower layer wire by etching the interlayer diffusion preventing film within the via hole and forming an adhering film to adhere to an area ranging from the upper surface of the lower layer wire to a side surface of the second insulating layer within the via hole to an extent such that, in the event metal is removed from a surface of said lower layer wire as a result of said etching, said metal adheres to said adhering film and is inhibited from adhering to said second insulating layer;

wherein the adhering film comprises material removed from the interlayer diffusion preventing film as a result of said etching; and (g) forming a conductive second diffusion preventing film on an inner surface of the via hole and forming a conductor with which the via hole is filled over the second diffusion preventing film.

11. The method according to claim 10, wherein the adhering film has a width of contact with the lower layer wire of 1 nm to 7 nm and a height of 3 nm to 15 nm.

12. The method according to claim 10, wherein the interlayer diffusion preventing film is etched by sputtering etching.

13. The method according to claim 10, wherein the interlayer diffusion preventing film has a film thickness of 10 nm to 50 nm.

14. The method according to claim 10, wherein the interlayer diffusion preventing film and the second diffusion preventing film comprise a single layer film comprising material selected from Ta, Ti, W, and compounds thereof or a laminated film of two or more layers comprising material selected from Ta, Ti, W, and compounds thereof.

15. The method according to claim 10, wherein the lower layer wire comprises either copper or a copper alloy that includes one or more types from among tin, zirconium and palladium.

16. The method according to claim 10, wherein in (a), a plurality of lower layer trenches are formed, in (b), the first diffusion preventing film and lower layer wire are formed within each of the lower layer trenches, and in (c), the interlayer diffusion preventing film is formed on top of each of the lower layer wires to be separated from each other, so that lower layer wires having different potentials can be prevented from short-circuiting.

17. The method according to claim 10, wherein in (b), the lower layer wire is formed up to a height which is lower than the upper surface of the first insulating layer by an amount that is approximately equal to the film thickness of the interlayer diffusion preventing film.

18. A method for forming a wire structure comprising:

(a) forming a lower layer trench in an outer surface of a first insulating layer;

(b) forming a first diffusion preventing film on an inner surface of the lower layer trench and forming a lower layer wire with which the lower layer trench is filled over the first diffusion preventing film, wherein said lower layer wire comprises an upper surface;
(c) forming an interlayer diffusion preventing film on the upper surface of the lower layer wire, wherein the interlayer diffusion preventing film comprises a high melt point metal or a high melt point metal compound and entirely covers the upper surface of the lower layer wire;
(d) forming a second insulating layer over the interlayer diffusion preventing film and first insulating layer;
(e) etching the second insulating layer to form a via hole which reaches the interlayer diffusion preventing film directly above the lower layer wire;
(f) exposing the lower layer wire by etching the interlayer diffusion preventing film within the via hole and forming an adhering film to adhere to an area ranging from an upper surface of the lower layer wire to a side surface of the second insulating layer within the via hole, the adhering film and the interlayer diffusion preventing film comprising a same material; and
(g) forming a conductive second diffusion preventing film on an inner surface of the via hole and forming a conductor with which the via hole is filled over the second diffusion preventing film; and wherein:
(e) includes forming an upper layer trench which continues to the via hole by etching the second insulating layer, and
(g) includes forming the second diffusion preventing film on an inner surface of the upper layer trench and forming an upper layer wire with which the upper layer trench is filled in over the second diffusion preventing film.

* * * * *